(12) United States Patent
Smith (10) Patent No.: US 6,288,899 B1
(45) Date of Patent: Sep. 11, 2001

(54) METHOD AND APPARATUS FOR HEAT DISSIPATION IN A MULTI-PROCESSOR MODULE

(75) Inventor: Grant M. Smith, Bryn Athyn, PA (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/500,879

(22) Filed: Feb. 9, 2000

(51) Int. Cl.$^7$ .................................................. H05K 7/20
(52) U.S. Cl. ...................... 361/690; 165/80.3; 257/722; 361/703
(58) Field of Search ..................... 454/184; 257/722; 165/80.3, 185, 146; 174/16.3; 361/687, 690, 692, 703, 694–697, 704, 716–719

(56) References Cited

U.S. PATENT DOCUMENTS

| | | | |
|---|---|---|---|
| 5,022,462 | * | 6/1991 | Flint . |
| 5,519,575 | * | 5/1996 | Chiou . |
| 5,771,153 | * | 6/1998 | Sheng . |
| 5,815,371 | * | 9/1998 | Jeffries . |
| 5,835,347 | * | 11/1998 | Chu . |
| 5,927,386 | * | 7/1999 | Lin . |
| 6,067,227 | * | 5/2000 | Katsui . |
| 6,118,656 | * | 9/2000 | Wang . |
| 6,145,586 | * | 11/2000 | Lo . |

\* cited by examiner

Primary Examiner—Gerald Tolin
(74) Attorney, Agent, or Firm—Ratner & Prestia; Mark T. Starr; Lisa A. Rode (57) ABSTRACT

This invention provides a heat sink for dissipating heat from an electronic component to be cooled by air flow. The heat sink includes a base configured to be mounted to the electronic component to receive heat transferred from the electronic component. The base has a center extending along the direction of air flow. The heat sink also includes a plurality of fins projecting from the base. Each of two adjacent fins is positioned on opposite sides of the center of the base and is spaced laterally from the center of the base. The adjacent fins define a gap extending across the center of the base. The gap between the adjacent fins reduces the temperature increase of air flowing adjacent the center of the base. This invention also provides a circuit assembly and a method for cooling an electronic component.

21 Claims, 7 Drawing Sheets

(5 of 7 Drawing Sheet(s) Filed in Color)

METHOD AND APPARATUS FOR HEAT DISSIPATION IN A MULTI-PROCESSOR MODULE

FIELD OF THE INVENTION

This invention relates to a method and apparatus for heat dissipation. More specifically, this invention relates to heat dissipation in a circuit assembly, such as a multi-processor module, in which electronic components are positioned adjacent one another along the path of cooling air flow.

BACKGROUND OF THE INVENTION

As microprocessor frequencies increase in newly-developed computer systems, the power requirements for the processor components can create significant challenges. For example, in order to meet the dynamic power requirements of such systems, power modules are preferably placed in close proximity to the respective processor components. These factors make adequate heat dissipation important to system performance.

In some configurations, the flow path of cooling air is designed such that the cooling air passes the processor components first and then passes their respective power modules. On the other hand, other packaging schemes may have this air flow direction reversed in order to optimize the mechanical packaging of the system as well as the system's performance. In other words, the air flow path in such systems is designed so that the air passes the power modules first and then passes their respective processor components.

Power modules are often relatively large in comparison to the processor components and can limit the accessibility of the cooling air flow to the processor components when the power modules are positioned upstream of the processor components. The power modules also tend to dissipate a significant amount of heat and can add significant heat to the processor component area. Accordingly, cooling air used to dissipate heat from the processor components is preheated by the power modules before the cooling air reaches the processor components. This preheating effect adds an additional burden on the cooling system.

There remains a need for a method and apparatus for heat dissipation that can be used advantageously in systems in which electronic components are positioned adjacent one another along the path of cooling air flow. More specifically, a method and apparatus is needed that can be used in connection with the cooling of a power module to improve the cooling of an adjacent processor component when the power module is positioned upstream of the processor component. More broadly, there is a need for a method and apparatus for heat dissipation for use in systems in which multiple heat sources are positioned along the path of cooling air flow, where the dissipation of heat from the downstream heat source may be important.

SUMMARY OF THE INVENTION

This invention provides a heat sink for dissipating heat from an electronic component to be cooled by air flow. The heat sink includes a base configured to be mounted to the electronic component to receive heat transferred from the electronic component. The base has a center extending along the direction of air flow.

The heat sink also includes a plurality of fins projecting from the base. Each of two adjacent fins is positioned on opposite sides of the center of the base and is spaced laterally from the center of the base. The adjacent fins therefore define a gap extending across the center of the base. The gap between the adjacent fins reduces the temperature increase of air flowing adjacent the center of the base.

This invention also provides a circuit assembly including an electronic component to be cooled by air flow; a heat sink according to this invention; and an adjacent electronic component, also to be cooled by air flow, located downstream of the electronic component. The gap between the adjacent fins of the heat sink reduces the temperature increase of air flowing adjacent the center of the base of the heat sink to the adjacent electronic component.

This invention further provides a method for cooling an electronic component and for reducing the temperature increase of cooling air flowing to an adjacent electronic component located downstream of the electronic component. The method includes mounting to the electronic component a heat sink according to this invention. Air is urged through the gap between the adjacent fins of the heat sink, thereby reducing the temperature increase of air flowing adjacent the center of the base of the heat sink to the adjacent electronic component.

BRIEF DESCRIPTION OF THE DRAWINGS

The file of this patent contains at least one drawing executed in color. Copies of this patent with color drawing(s) will be provided by the Patent and Trademark Office upon request and payment of the necessary fee.

The invention will be described with reference to the exemplary embodiments illustrated in the figures, of which.

DETAILED DESCRIPTION OF THE INVENTION

Preferred features of embodiments of this invention will now be described with reference to the figures. It will be appreciated that the spirit and scope of the invention is not limited to the embodiments selected for illustration. Also, it should be noted that the drawings are not rendered to any particular scale or proportion. It is contemplated that any of the dimensions and materials described hereafter can be modified within the scope of this invention.

It has been discovered that the temperature of air flow as it exits a heat sink is not uniform throughout the profile of the heat sink. More specifically, the temperature of air adjacent the base of the heat sink tends to be significantly higher than the temperature of the air spaced from the base at regions adjacent the tips of the cooling fins. Also, the temperature of air toward the center of the heat sink (away from the side edges of the heat sink) tends to be higher than the temperature of air in regions adjacent the outside edges of the heat sink. This non-uniform heating of the air is due primarily to the thermal spreading resistance of the heat sink's base and fin portions. This effect will be described in further detail with reference to FIG. 2.

It has also been discovered that the velocity of air flow as it exits a heat sink is not uniform. The velocity of air flow adjacent the base of the heat sink tends to be significantly lower than the velocity of the air spaced from the base at regions adjacent the tips of the cooling fins. The velocity of air toward the center of the heat sink (away from the side edges of the heat sink) also tends to be lower than the velocity of air flow in regions adjacent the outside edges of the heat sink. This effect will be described in further detail with reference to FIG. 3.

Accordingly, the central, base region of the heat sink tends to deliver lower velocity, higher temperature air flow. In applications in which a heat source such as a power module is positioned upstream from an adjacent heat source such as a processor along the path of cooling air flow, the lower velocity, higher temperature air delivered from the heat sink of the upstream heat source flows toward the central, base region of the heat sink of the downstream heat source. This lower, central region of the downstream heat sink is perhaps the most effective area for heat removal from the downstream heat sink because that is the location at which heat from the downstream heat source enters the downstream heat sink. In other words, the central, lower region of the heat sink is exactly where one would not want to deliver lower velocity, higher temperature air for cooling purposes.

Figure 1:
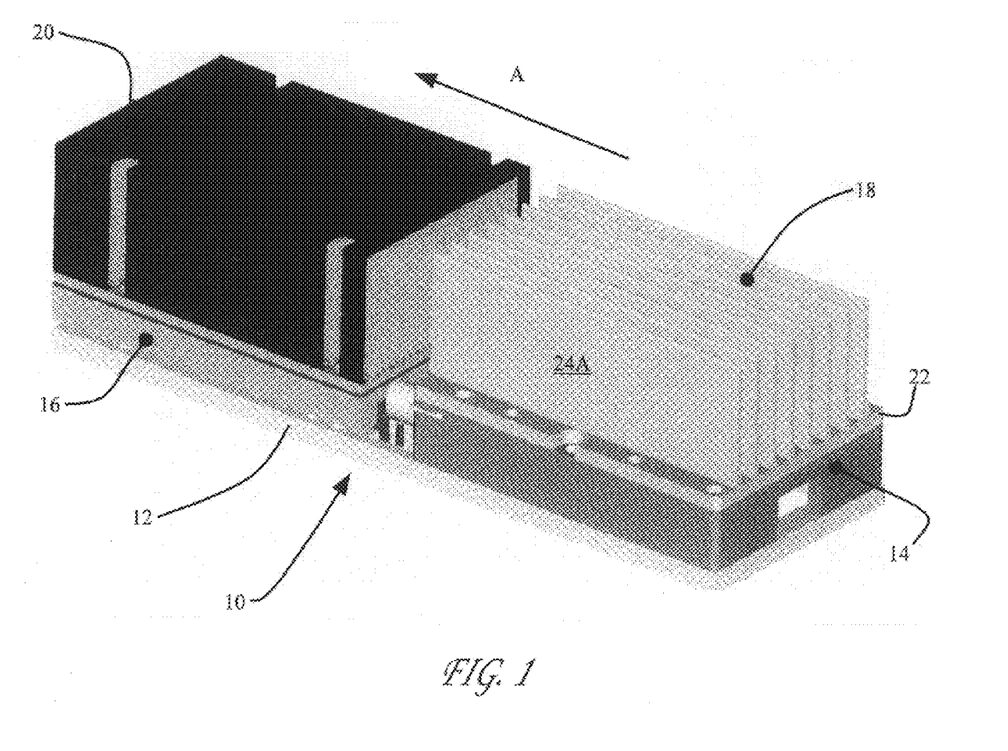
FIG. 1 is a perspective view of an embodiment of a circuit assembly.
Figure 2:
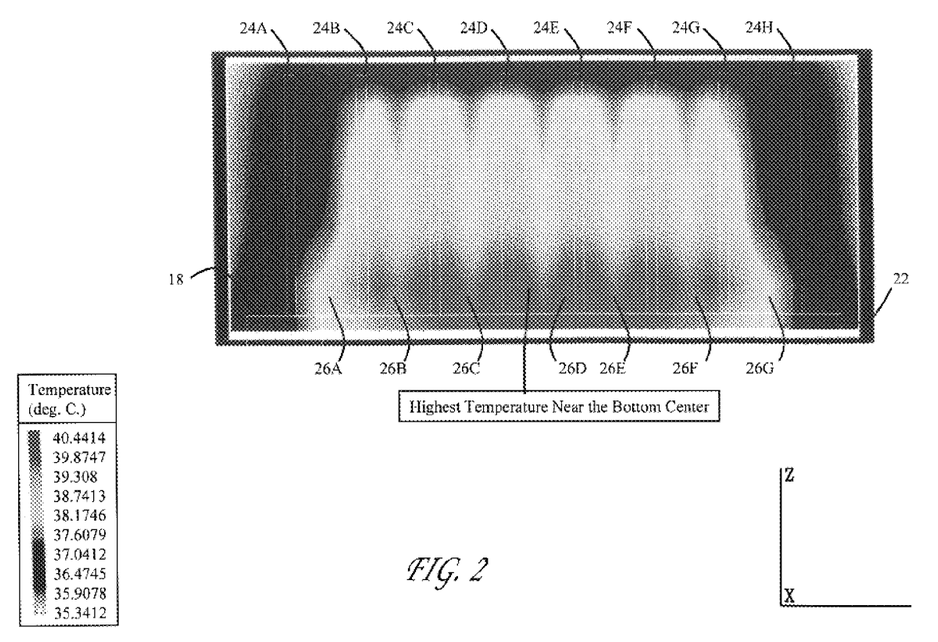
FIG. 2 is a cross-sectional end view of a heat sink component of the circuit assembly shown in FIG. 1, illustrating the temperature profile of air flow associated with the heat sink.
Figure 3:
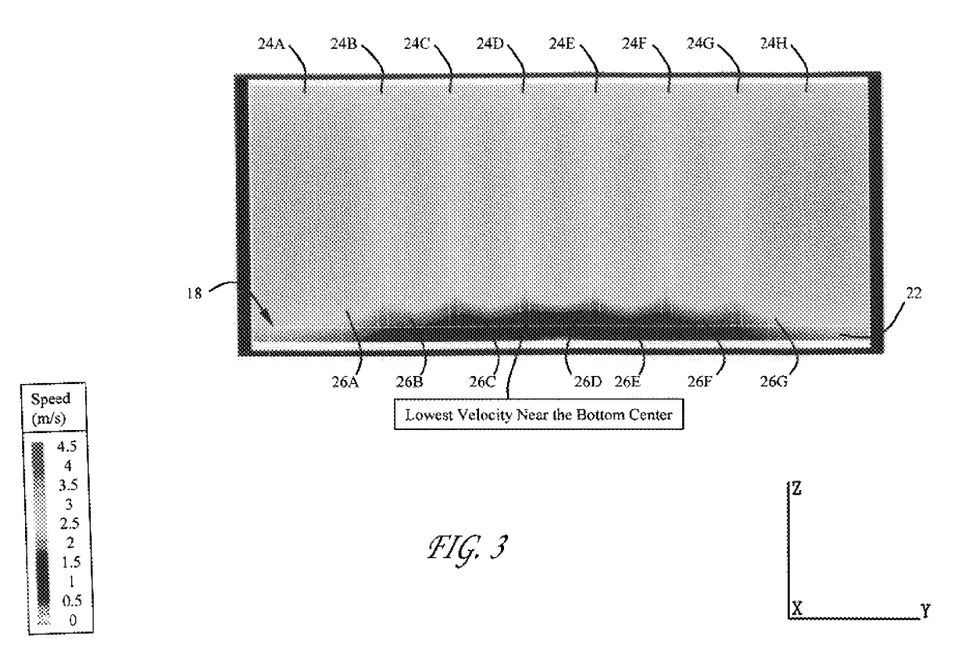
FIG. 3 is a cross-sectional end view of a heat sink component of the circuit assembly shown in FIG. 1, illustrating the velocity profile of air flow associated with the heat sink.

These principals are illustrated in FIGS. 1–3. Referring to FIG. 1, a circuit assembly 10 includes a circuit board 12 on which a power module 14 and a processor 16 are mounted. The power module 14 and the processor 16 generate heat during operation of the circuit assembly 10. Power module 14 is located upstream from processor 16 as is indicated by the air flow direction "A" of the cooling air. In other words, processor 16 is positioned adjacent to, and downstream from, power module 14.

A power module heat sink 18 is mounted to the top of power module 14 in order to facilitate the dissipation of heat generated by power module 14 during operation. Similarly, a processor heat sink 20 is mounted to the top of processor 16 in order to facilitate dissipation of heat generated by processor 16 during its operation. As is illustrated in FIG. 1, cooling air flow travels in a path along air flow direction "A". Cooling air first enters an upstream end of power module heat sink 18, exits a downstream end of power module heat sink 18, and then enters an upstream end of processor heat sink 20. Accordingly, the cooling air will tend to be preheated by power module heat sink 18 before it enters processor heat sink 20 for cooling of processor 16.

Referring generally to FIGS. 1–3, power module heat sink 18 includes a base 22 and plurality of fins 24A–24H, which project from base 22. Spaces 26A–26G are defined between adjacent fins 24A–24H. More specifically, for example, a space 26A is defined between adjacent fins 24A and 24B. Fins 24A–24H are spaced at substantially constant intervals and, therefore, the spaces 26A–26G have substantially the same widths throughout the profile of heat sink 18.

Referring specifically to FIG. 2, a representation of the temperature profile of air flow as it enters processor heat sink 20 is illustrated. The cross-sectional profile of the power module heat sink 18 is superimposed on the temperature profile for illustrative purposes. The color representation provided in FIG. 2 indicates that the region of the air flow having the highest temperature is adjacent the central, base region of power module heat sink 18. In other words, the exiting air temperature is highest in the region adjacent base 22 of heat sink 18 and in the spaces (such as spaces 26B–26F) toward the central region of base 22. Conversely, the air temperature is coolest toward the uppermost region of the fins 24A–24H and toward the outermost fins 24A and 24H.

Referring now to FIG. 3, the velocity profile of air entering processor heat sink 20 is illustrated. Again, the profile of power module heat sink 18 is superimposed. The color representation provided in FIG. 3 indicates that the velocity of the air exiting the power module heat sink 18 is lowest at a location adjacent the central portion of heat sink 18. More specifically, the velocity of the air flow exiting power module heat sink 18 is lowest in the region adjacent the central region of base 22 of heat sink 18. The portions of the air flow profile toward the top of the fins 24A–24H have a higher velocity as do the portions of the air flow profile adjacent outer fins 24A and 24H.

This invention provides a heat sink that is capable of providing higher velocity, lower temperature air to the most effective area of a downstream heat sink. In order to do so, the heat sink has fins positioned such that the heat transfer surface area of the heat sink is concentrated toward the outer side edges of the heat sink and reduces or eliminates the use of fins in the central region of the heat sink.

Although such a heat sink would be thought to compromise the cooling of the component to which it is mounted and the circuit assembly as a whole by reducing the heat transfer surface area of the heat sink, it has been surprisingly discovered that the heat sink according to this invention improves the overall cooling of the circuit assembly without unduly compromising the cooling of the component to which it is mounted. In other words, by reducing or eliminating the fins in the central region of the heat sink, cooling air is permitted to enter the most effective area of the downstream heat sink at a lower temperature. In other words, preheating of the cooling air entering the most effective area of the downstream heat sink is reduced. Additionally, it has been discovered that the heat sink according to this invention directs higher velocity air toward the center of the downstream heat sink. This approach has been discovered to be effective in improving heat dissipation from the downstream component.

Referring generally to FIGS. 4 and 5A–5D, a circuit assembly 100 according to this invention includes an electronic component such as a power module 104 to be cooled by air flow; a heat sink 108 according to this invention; and an adjacent electronic component such as a processor 106, also to be cooled by air flow, located downstream of the electronic component. The gap 116B (FIG. 6) between adjacent fins 114B and 114C of heat sink 108 reduces the temperature increase of air flowing adjacent the center 122 (FIGS. 5A–5C) of the base 112 of the heat sink 108.

Figure 4:
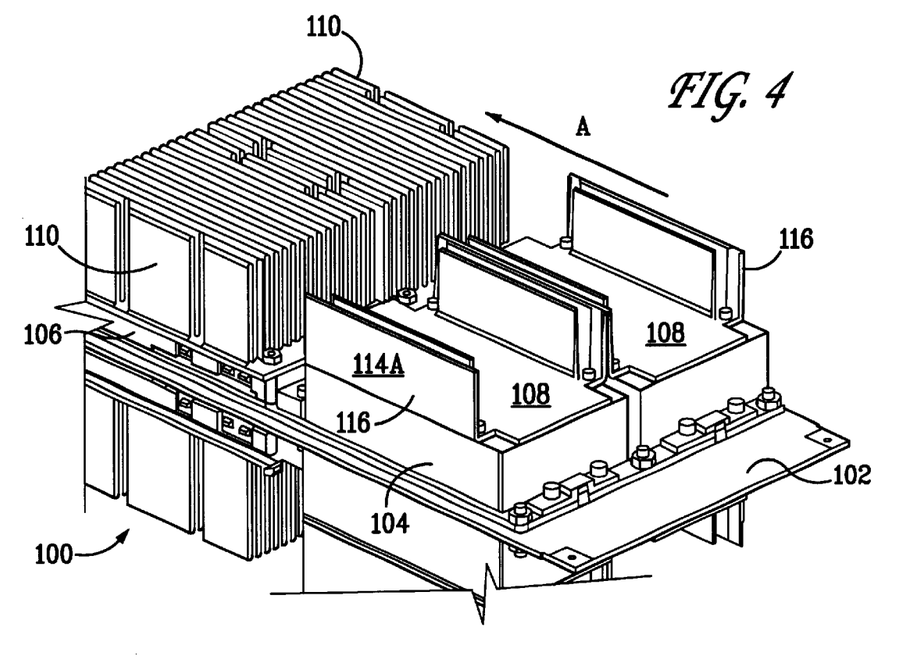
FIG. 4 is a perspective view of an embodiment of a circuit assembly according to this invention.

More specifically, circuit assembly 100 includes a circuit board 102. Four power modules 104 are mounted to circuit board 102 (two power modules 104 being mounted to the top surface of circuit board 102, and two power modules 104 being mounted to the board's bottom surface). Circuit assembly 100 also includes four processors 106, two of which are mount to the top surface of circuit board 102 and two of which are mounted to the board's bottom surface.

Each of the processors 106 is paired with one of the power modules 104. The processors 106 and power modules 104 of each pair are positioned closely adjacent one another in order to meet the dynamic power requirements of the processors. In the packaging scheme illustrated in FIG. 4, each of the four power modules 104 is positioned upstream from a respective one of the four processors 106. Accordingly, the cooling air introduced along the direction "A" first passes by the power modules 104 and then by the respective processors 106.

Each of the four power modules 104 is provided with a power module heat sink according to this invention, such as heat sink 108 for example. Similarly, each of the processors 106 is provided with a processor heat sink 110.

Figure 5A:
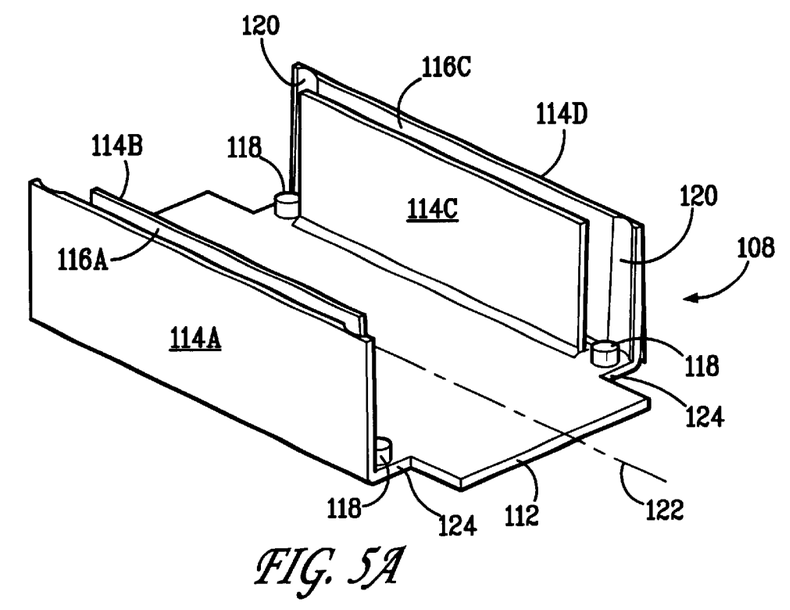
FIG. 5A is a perspective view of an embodiment of a heat sink, according to this invention, which is a component of the circuit assembly shown in FIG. 4.

The heat sink 108, according to this invention, includes a base 112 configured to be mounted to an electronic component such as a power module 104 to receive heat transferred from the electronic component. The base 112 has a center, such as center 122, extending along the direction of air flow "A".

Figure 6:
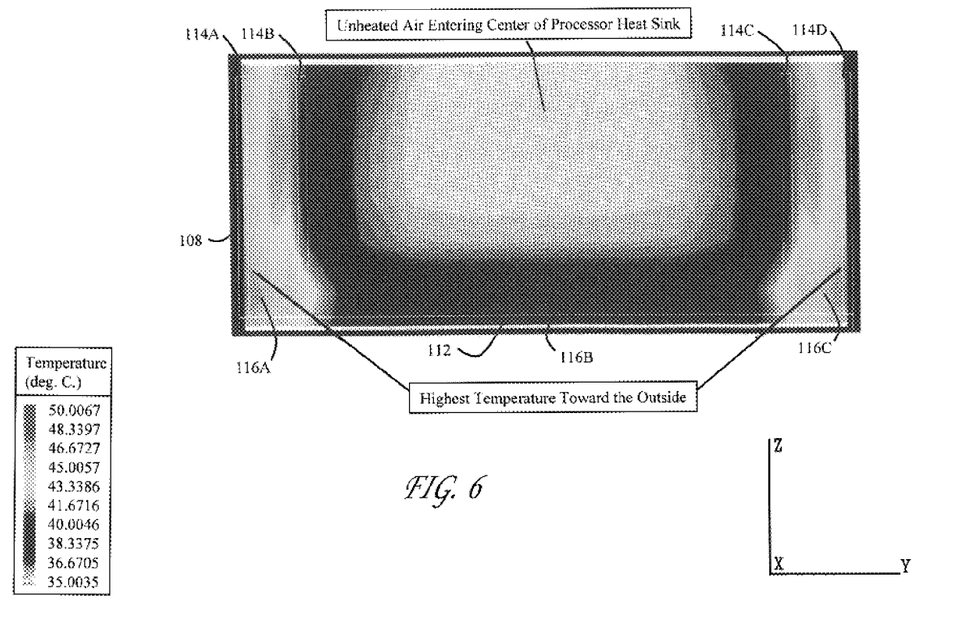
FIG. 6 is a cross-sectional end view of the heat sink shown in FIG. 5A, illustrating the temperature profile of air flow associated with the heat sink.

A plurality of fins such as fins 114A–114D project from the base 112 of the heat sink 108. Each of two adjacent fins 114B and 114C are positioned on opposite sides of the center 122 of base 112 and are spaced laterally from the center 122 of base 112. The adjacent fins 114B and 114C define a gap 116B extending across the center 122 of the base 112. The gap 116B between adjacent fins 114B and 114C reduces the temperature increase of air flowing adjacent the center 122 of base 112 by reducing the heat transfer surface area of the heat sink toward the central region of the heat sink.

In the preferred embodiment illustrated in FIGS. 5A–5D, at least one of the fins 114A–114D extends along each edge portion 124 of the base 112. Also, each of the adjacent fins 114B and 114C can extend along an opposite edge portion 124 of the base 112. The heat sink can also include at least two fins, such as fins 114A and 114B or fins 114C and 114D, extending along each edge portion 124 of the base 112. Edge portions 124 preferably extend beyond the side edges of power module 104, thereby facilitating positioning of fins farther outwardly to the sides and increasing the size of the gap at the center region of the heat sink.

The fins 114A–114D can project the same distance (height "H", for example) from the base 112 as shown. Also, the gap 116A or 116C between the fins, such as fins 114A and 114B or fins 114C or 114D, extending along each of the edge portions 124 of the base 112 is narrower than the gap 116B between the adjacent fins 114B and 114C. The fins 114A–114D are substantially perpendicular to the base 112 in the preferred embodiment.

Figure 5B:
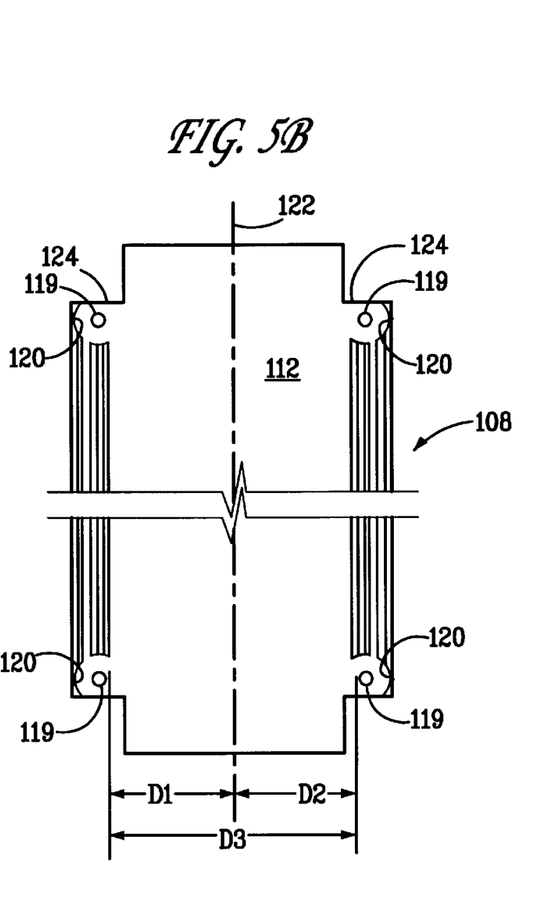
FIG. 5B is a top view of the heat sink shown in FIG. 5A.
Figure 5C:
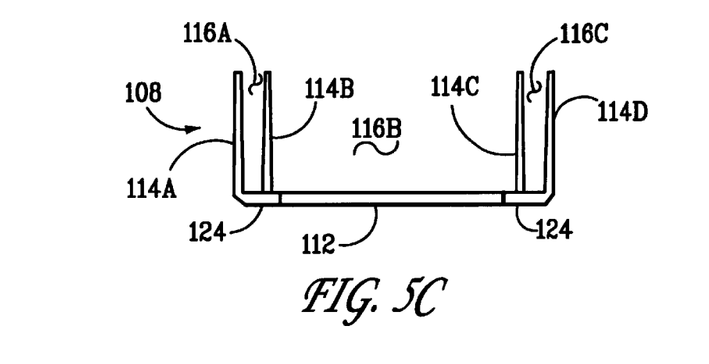
FIG. 5C is a front view of the heat sink shown in FIG. 5A.
Figure 5D:
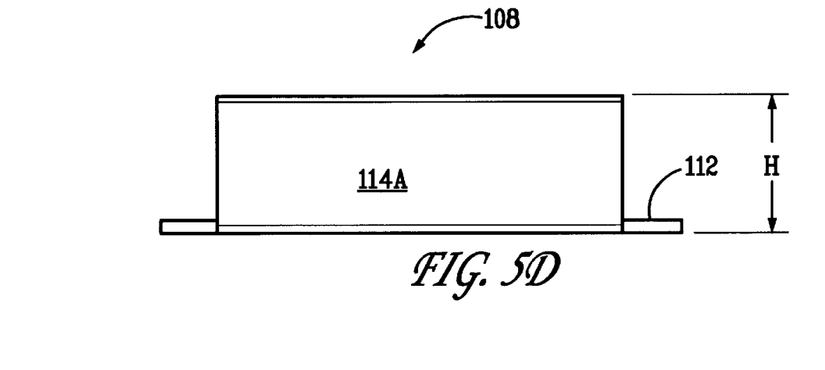
FIG. 5D is a side view of the heat sink shown in FIG. 5A.

Referring specifically to FIG. 5C, fins 114B and 114C are each spaced from center 122 of base 112. Specifically, fin 114B os spaced a distance D1 from the center 122, and fin 114C is spaced a distance D2 from center 122. Although distance D1 is about the same as distance D2 in FIG. 5B, these distances need not be the same. For example, distances D1 and D2 can be selected and adjusted depending on the configuration of (and the concentration of heat generated by) the component to which it is attached or the relative position of the adjacent, downstream component. As shown in FIG. 5B, there is a distance D3 (the sum of distances D1 and D2) between the faces of fins 114B and 114C.

The gap 116B between the adjacent fins 114B and 114C reduces the velocity decrease of air flowing adjacent the center 122 of the base 112. Also, the fins 114A–114D are arranged such that the temperature of air flowing adjacent edge portions 124 of the base 112 is higher than the temperature of air flowing adjacent the center 122 of the base 112. The fins are also arranged such that the velocity of air flowing adjacent the center 122 of the base 112 is higher than the velocity of air flowing adjacent edge portions 124 of the base 112.

Referring specifically to FIGS. 5B and 5C, fins 114A and 114B together define a space 116A, fins 114B and 114C together define a space 116B, and fins 114C and 114D define a space 116C. The height "H" (FIG. 5D) of each of fins 114A–114D is preferably the same. Alternatively, in order to decrease the collective heat transfer surface area of the fins toward the central region of heat sink 108, fins toward the center 122 of heat sink 108 (fins 114B and 114C, for example) can be made shorter than those fins positioned toward the outer edges of the heat sink 108 (fins 114A and 114D, for example).

Mounting hardware 118 is provided to mount heat sink 108 to a surface of a power module 104. Mounting holes 119 (FIG. 5B) are provided in heat sink 108 through which mounting hardware 118 is inserted for connection of heat sink 108 to the power module 104. Recesses 120 are preferably provided adjacent the positions of mounting hardware 118 in order to provide improved access for applying and removing the mounting hardware 118 for mounting or removing the heat sink 108. When heat sink 108 is mounted to the power module 104, heat is transferred from the power module 104 into the base 112 of the heat sink 108, thereby dissipating heat generated in the power module 104 during use. This heat is then transferred by conductive heat transfer through base 112 and into fins 114A–114D. Air flow along the surfaces of heat sink 108 then removes heat from fins 114A–114D and base 112 by means of convective heat transfer.

The fins 114A–114D are preferably oriented so that they are substantially parallel to the direction of air flow. Fins 114A–114D are positioned laterally outwardly at edge portions 124 of base 112. More specifically, fins 114A and 114B are positioned so that they extend along one edge portion 124 of base 112, and fins 114C and 114D are positioned so that they extend along an opposite edge portion 124 of base 112. Accordingly, fins 114B and 114C are spaced laterally from the center 122 of the base 112.

In this configuration, fins 114A–114D are arranged such that the temperature of air adjacent edge portions 124 of base 112 is higher than the temperature of air flow near the center 122 of base 112. Likewise, the fins 114A–114D are arranged such that the velocity of air flow near center 122 of base 112 is higher than the velocity of air flow adjacent edge portions 124 of base 112.

The space, such as 116A between the fins 114A and 114B extending along an edge portion 124, is smaller or narrower than the space or gap 116B, between the spaced fins 114B and 114C, that extends across the center 122 of the base 112.

Referring to FIG. 6, which provides a color illustration of the temperature profile of the air flow entering the processor's heat sink 110, the color legend indicates that the air in the region toward the center 122 of heat sink 108 is cooler as compared to the air near the outer edge portions 124 of heat sink 108. This cooler air is then delivered to the heat sink 110 of processor 106, thereby enhancing the cooling performance of the heat sink 110 and its ability to dissipate heat generated by processor 106 during operation.

Figure 7:
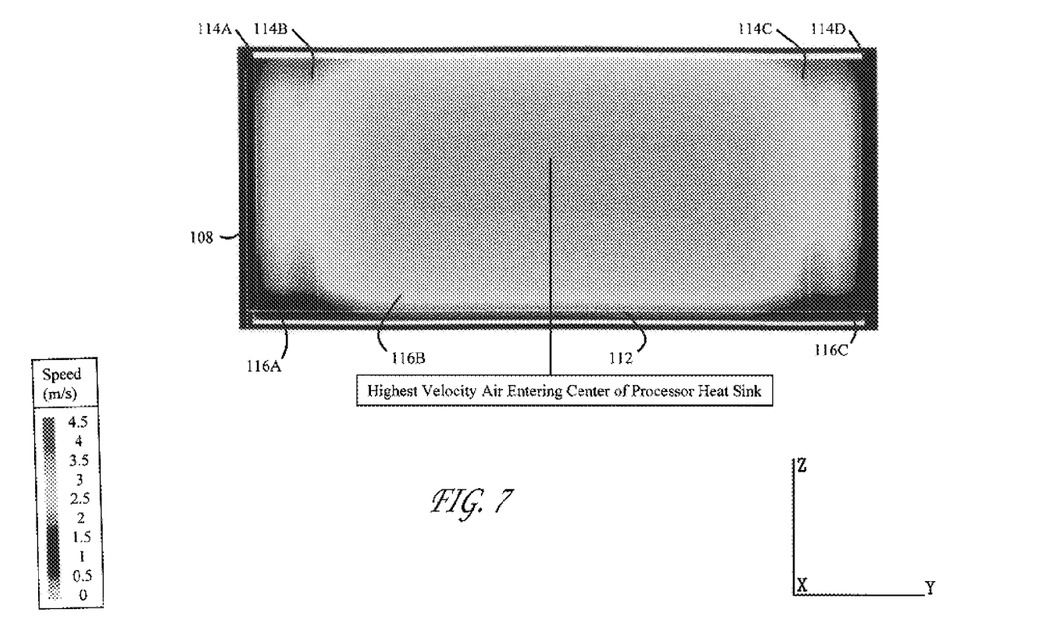
FIG. 7 is a cross-sectional end view of the heat sink shown in FIG. 5A, illustrating the velocity profile of air flow associated with the heat sink.

Referring now to FIG. 7, which provides a color representation of the velocity profile of air flow entering the processor's heat sink 110, the color legend indicates that higher velocity air is provided at the central region of heat sink 108. That higher-velocity air is then delivered to heat sink 110, thereby enhancing the dissipation of heat generated by processor 106 during operation.

EXAMPLE

Testing was conducted to determine the temperatures at selected points in a power module using two different types of heat sinks. The testing was also conducted to determine the effectiveness of the cooling of a processor mounted downstream of the power module.

A power module (AMP Inc. Serial No. 105) was mounted on a board. The power module was provided with nineteen (19) thermocouples to measure temperatures at selected points within or on the module. A thermocouple was also used to measure the ambient temperature. Another thermocouple was placed on the processor's heat sink to measure the temperature of the processor load.

The system was powered up and allowed to stabilize. The temperatures were recorded under typical case conditions (ambient air at 20 C. at sea level), with impellers running at normal speed, and under worst case conditions (ambient air at 35 C. and 8000 ft altitude). Under the worst case conditions, three (3) cooling impeller conditions were employed: motorized impellers (MI) moving at high speed, MI moving at high speed with one of the six (6) MI failed, and MI moving at high speed with another one of the six (6) MI failed.

Two different heat sinks were evaluated. The first heat sink was similar to heat sink 18 shown in FIGS. 1–3. The second heat sink was similar to heat sink 108 shown in FIGS. 4–7.

The results of the test indicate that none of the temperatures of the selected power module components exceeded temperatures that were acceptable to the manufacturer of the power module (AMP), even under the worst case conditions. Accordingly, the heat sink according to this invention provides adequate cooling of the power module despite the reduced heat transfer surface area along or near the center of the heat sink.

The results also indicate improved cooling of the processor using a heat sink according to this invention. Specifically, under typical case conditions, the heat sink of this invention reduced the processor temperature rise by about 7.3% as compared to the other heat sink design. Under these typical case conditions, the heat sink according to this invention lowered the processor temperature by about 3 C.

Even under the worst case conditions, the heat sink of this invention reduced the processor temperature rise by about 2.9% (MI moving at high speed), about 2.2% (MI moving at high speed with one of the six (6) MI failed), and about 1.3% (MI moving at high speed with another one of the six (6) MI failed). In each case, the heat sink according to this invention lowered the processor temperature.

Although this invention has been described with reference to various preferred features of the invention, it should be appreciated that variations and modifications of the preferred features can be made without departing from the spirit or scope of the invention. The preferred embodiment includes two fins at each edge portion of the base of the heat sink. It is also contemplated that a single fin at each edge portion may be suitable to dissipate the heat from a heat source such as power module 104, depending on the heat dissipation requirements of the component and the size and shape (and resulting heat transfer surface area) of the fin. Also, it is contemplated that, in some circumstances, it will be desirable to include more than two fins along or near each edge portion of the base of the heat sink.

Also, although each of the fins are illustrated with a constant height, it will be appreciated that the height of the fins can be varied in order to optimize the allocation of heat transfer surface area toward the edge portions of the base of the heat sink. In other words, taller and/or longer fins can be provided toward the outer edges of the base in order to maximize the surface area of the outermost fins. Fins closer to the center to the base of the heat sink can be shorter (in height and/or length), thereby reducing the heat transfer surface area at locations more proximate to the center of the base of the heat sink.

Also, although the embodiment of heat sink 108 shown in the figures does not include any fins at or adjacent to center 122 of base 112, it is contemplated that a heat sink according to this invention could include one or more fins along or adjacent the center of the heat sink. In order to reduce the heat transfer surface area of the fins toward the center of the heat sink, the fins at or near the center of the heat sink can be smaller in height, can have a shorter length along the direction of air flow, can have larger spaces between adjacent fins, or can otherwise be provided with a smaller heat transfer surface area by changing the shape of the fin(s) or removing surface area from the fin(s). Also, the shape and configuration and materials of the fins can be modified from those shown and described herein.

It will be appreciated that other modifications can be made to the illustrated embodiments without departing from the scope of the invention. The scope of the invention is separately defined in the appended claims.

What is claimed is:

1. In a circuit assembly including an air mover, an electronic component cooled by air flow from said air mover, a downstream component also cooled by said air flow, and a heat sink dissipating heat from said electronic component, said heat sink comprising:

a base mounted adjacent and thermally coupled to the electronic component to receive heat transferred from the electronic component, said base having a center extending along the direction of said air flow from said air mover; and a plurality of fins projecting from said base and extending along the direction of said air flow from said air mover;

each of two adjacent fins being positioned on opposite sides of said center of said base and being spaced laterally from said center of said base, said adjacent fins defining a gap extending across said center of said base, said gap between said adjacent fins providing an open passage extending along the direction of said air flow from said air mover and reducing the temperature increase of air flowing adjacent said center of said base from said air mover to said downstream component.

2. The circuit assembly recited in claim 1, at least one of said fins extending along an edge portion of said base.

3. The circuit assembly recited in claim 2, each of said adjacent fins extending along an opposite edge portion of said base.

4. The circuit assembly recited in claim 1, comprising at least two fins extending along edge portions of said base.

5. The circuit assembly recited in claim 4, each of said fins projecting substantially the same distance from said base.

6. The circuit assembly recited in claim 4, the gap between said fins extending along each of said edge portions of said base being narrower than said gap between said adjacent fins.

7. The circuit assembly recited in claim 1, said fins being substantially perpendicular to said base.

8. The circuit assembly recited in claim 1, said gap between said adjacent fins reducing the velocity decrease of air flowing adjacent said center of said base from said air mover to said downstream component along said direction of said air flow.

9. The circuit assembly recited in claim 1, said fins being arranged such that the temperature of air flowing from said air mover adjacent edge portions of said base is higher than the temperature of air flowing from said air mover adjacent said center of said base.

10. The circuit assembly recited in claim 1, said fins being arranged such that the velocity of air flowing from said air mover adjacent said center of said base is higher than the velocity of air flowing from said air mover adjacent edge portions of said base.

11. The circuit assembly recited in claim 1, said air mover being an impeller.

12. A circuit assembly comprising:
    an electronic component cooled by air flow from an air mover;
    a heat sink dissipating heat from said electronic component, said heat sink including a base mounted and thermally coupled to said electronic component to receive heat transferred from said electronic component, said base having a center extending along the direction of said air flow from said air mover, said heat sink also including a plurality of fins projecting from said base and extending along the direction of said air flow from said air mover, each of two adjacent fins being positioned on opposite sides of said center of said base and being spaced laterally from said center of said base, said adjacent fins defining an open gap extending across said center of said base; and
    an adjacent electronic component cooled by said air flow from said air mover, said adjacent electronic component being located downstream of said electronic component;
    said gap between said adjacent fins of said heat sink reducing the temperature increase of air flowing adjacent said center of said base of said heat sink from said air mover to said adjacent electronic component.

13. The circuit assembly recited in claim 12, comprising at least two fins extending along opposite edge portions of said base.

14. The circuit assembly recited in claim 13, the gap between said fins extending along each of said edge portions of said base being narrower than said gap between said adjacent fins.

15. The circuit assembly recited in claim 12, said electronic component being a power supply.

16. The circuit assembly recited in claim 12, said adjacent electronic component being a processor.

17. The circuit assembly recited in claim 12, wherein opposite edge portions of said base extend beyond side edges of said electronic component.

18. The circuit assembly recited in claim 12, further comprising another heat sink including a base mounted to said adjacent electronic component.

19. The circuit assembly recited in claim 12, said base of said heat sink having a surface mounted to said electronic component, and said fms projecting from an other surface of said base.

20. The circuit assembly recited in claim 19, said fins projecting from a surface of said base opposed from said surface of said base that is mounted to said electronic component.

21. A method for cooling an electronic component with an air mover and for reducing the temperature increase of cooling air flowing to an other electronic component located downstream of the electronic component, said method comprising the steps of:
    (a) mounting to the electronic component a heat sink, the heat sink including a base positioned to receive heat transferred from the electronic component, the base having a center extending along the direction of air flow from the air mover, the heat sink also including adjacent fins extending along the direction of air flow from the air mover and being positioned on opposite sides of the center of the base, thereby defining an open gap extending between the adjacent fins and across the center of the base along the direction of air flow from the air mover;
    (b) urging air through the open gap between the adjacent fins of the heat sink and toward the other electronic component, thereby reducing the temperature increase of air flowing adjacent the center of the base of the heat sink to the other electronic components.

* * * * *